United States Patent
Ide (10) Patent No.: US 11,527,925 B2
(45) Date of Patent: Dec. 13, 2022

(54) WIRELESS TRANSMISSION SYSTEM, CONTROL METHOD, AND STORAGE MEDIUM

(71) Applicant: CANON KABUSHIKI KAISHA, Tokyo (JP)

(72) Inventor: Takeshi Ide, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/505,142

(22) Filed: Oct. 19, 2021

(65) Prior Publication Data

US 2022/0131423 A1  Apr. 28, 2022

(30) Foreign Application Priority Data

Oct. 22, 2020  (JP) .............................. JP2020-177670

(51) Int. Cl.
*H02J 50/80* (2016.01)
*H02J 50/00* (2016.01)
*H01L 31/12* (2006.01)

(52) U.S. Cl.
CPC ............ *H02J 50/80* (2016.02); *H01L 31/125* (2013.01); *H02J 50/005* (2020.01)

(58) Field of Classification Search
CPC ........ H02J 50/80; H02J 50/005; H01L 31/125
USPC ....................................................... 307/104
See application file for complete search history.

(56) References Cited

U.S. PATENT DOCUMENTS

| 2013/0147283 A1* | 6/2013 | Kawano | ................ H01F 27/346 307/104 |
| 2015/0001953 A1* | 1/2015 | Fukuzawa | ............. H01F 27/363 307/104 |
| 2015/0015080 A1* | 1/2015 | Kato | ....................... H01F 38/14 307/104 |
| 2015/0054348 A1* | 2/2015 | Akiya | ................... H02J 50/005 307/104 |

FOREIGN PATENT DOCUMENTS

JP          2005302964 A     10/2005

* cited by examiner

*Primary Examiner* — Alfonso Perez Borroto
(74) *Attorney, Agent, or Firm* — Canon U.S.A., Inc. IP Divison (57) ABSTRACT

A wireless transmission system includes a first substrate and a second substrate. A first coil used for wireless power transmission, a first light emitting element that is arranged inside the first coil and that is used for wireless communication, and a first light receiving element arranged on the same circumference as that of the first light emitting element are arranged on the first substrate. The first substrate and the second substrate are arranged so as to be opposed to each other so that a second light emitting element and a second light receiving element, which are arranged on the second substrate, are opposed to the first light emitting element and the first light receiving element.

11 Claims, 6 Drawing Sheets

WIRELESS TRANSMISSION SYSTEM, CONTROL METHOD, AND STORAGE MEDIUM

BACKGROUND

Field

The present disclosure relates to a wireless transmission system.

Description of the Related Art

Bidirectional communication can be performed in a portion of a joint of a robot or the like while power for driving a motor is being transferred between a fixed body and a rotating body in order to perform control, such as driving of the motor. The rotating body is generally relatively rotated with respect to the fixed body side around a shaft provided around a central axis. Although a method of using coil-shaped lead wire or a slip ring around the shaft is used for the communication between the fixed body and the rotating body, use of no wire (wireless communication) is known to be advantageous in terms of maintenance and so on.

Japanese Patent Laid-Open No. 2005-302964 discloses a method of realizing wireless communication and wireless power transmission through optical coupling using multiple light emitting elements and light receiving elements, which are arranged around a shaft, and electromagnetic induction using a transformer winding.

However, it is required to form the joint portion into a short and compact shape because of an increased request for precise operation of a robot to realize the communication with high reliability with minimum influence of inertia. In the method described in Japanese Patent Laid-Open No. 2005-302964, in order to avoid a reduction in the communication reliability due to light interference in the bidirectional optical communication, the light is blocked by spatially separating the optical communication path for upward communication from the optical communication path for downward communication to realize the highly reliable communication with no light interference. In such a case, it is necessary to provide two optical communication spaces separated in the axis direction or the radial direction of the shaft and to arrange the transformer winding for the wireless power transmission in the method disclosed in Japanese Patent Laid-Open No. 2005-302964. As a result, the joint portion is increased in size.

SUMMARY

Various embodiments of the present disclosure provide further reductions in the size of a wireless transmission system that performs wireless power transmission and wireless communication by appropriately arranging elements used in wireless communication in the wireless transmission system.

A wireless transmission system according to one embodiment of the present disclosure includes a first substrate, a first coil that is arranged on the first substrate and that is used for wireless power transmission, at least one first light emitting element that is arranged on a circumference on the first substrate and inside the first coil and that is used for wireless communication, at least one first light receiving element that is arranged on the same circumference as that of the at least one first light emitting element and that is used for the wireless communication, a second substrate, a second coil that is arranged on the second substrate and that is used for the wireless power transmission, at least one second light emitting element that is arranged on a circumference on the second substrate and inside the second coil and that is used for the wireless communication, and at least one second light receiving element that is arranged on the same circumference as that of the at least one second light emitting element and that is used for the wireless communication. The first substrate and the second substrate are arranged so as to be opposed to each other so that the first coil, the at least one first light emitting element, and the at least one first light receiving element are opposed to the second coil, the at least one second light emitting element, and the at least one second light receiving element.

Further features of the present disclosure will become apparent from the following description of example embodiments with reference to the attached drawings.

DESCRIPTION OF THE EMBODIMENTS

Various example embodiments of the present disclosure will herein be described in detail with reference to the drawings. The configurations described in the embodiments described below are only examples and the present invention is not limited to the illustrated configurations.

Figure 1A:
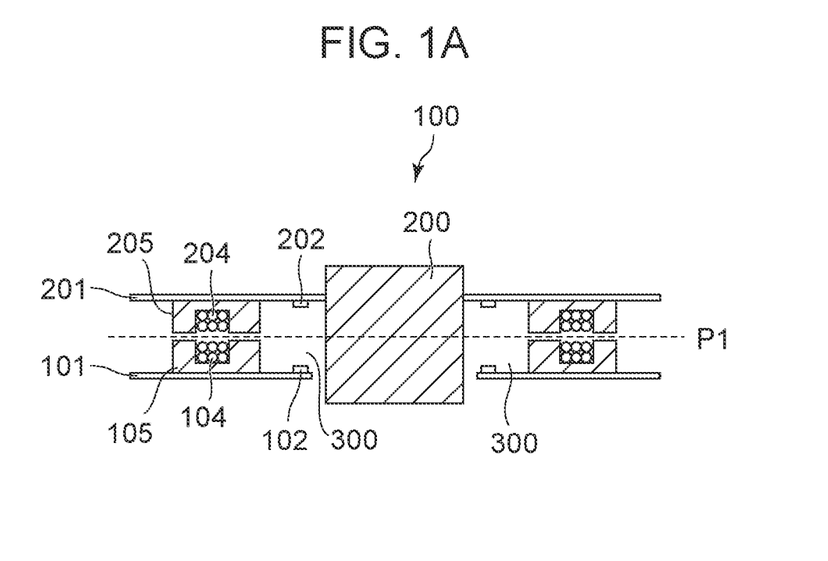
FIG. 1A and FIG. 1B are diagrams for describing a structure of a wireless transmission system according to one embodiment.
Figure 1B:
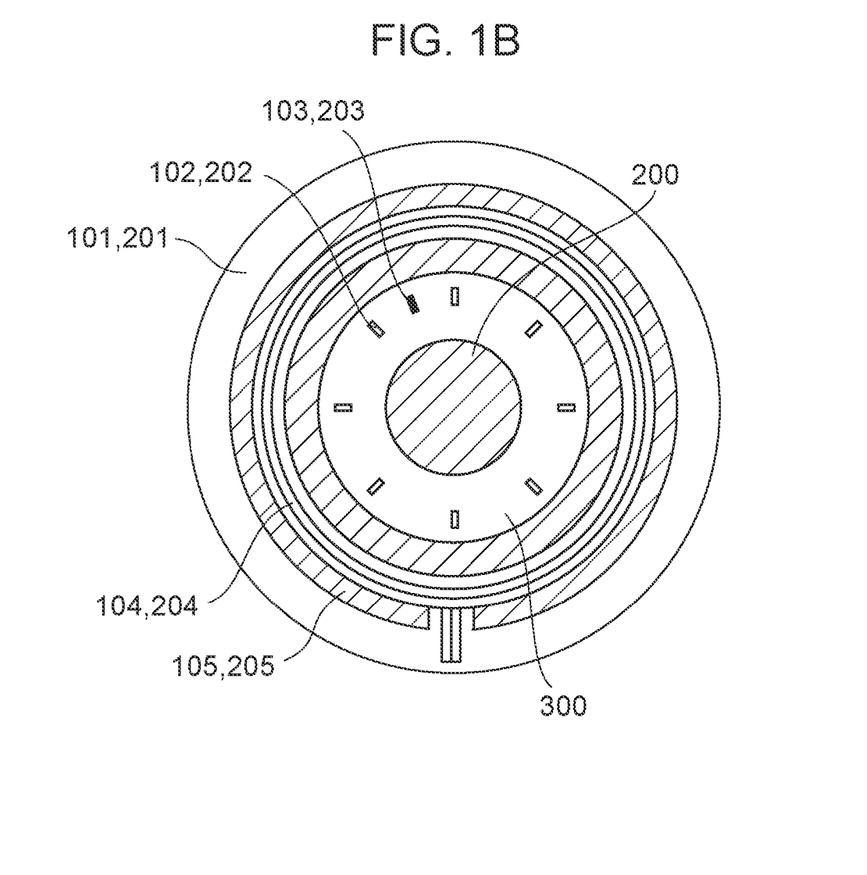

FIG. 1A and FIG. 1B are diagrams for describing a structure of a wireless transmission system 100 according to an embodiment. FIG. 1A is a diagram when the wireless transmission system 100 is viewed from a direction perpendicular to a shaft 200 and FIG. 1B is a diagram when the wireless transmission system 100 is viewed from a direction vertical to the shaft 200 on a plane P1 illustrated in FIG. 1A. FIG. 1B illustrates both a case in which the wireless transmission system 100 is viewed in the direction of a rotation-side substrate 201 on the plane P1 and a case in which the wireless transmission system 100 is viewed in the direction of a fixed-side substrate 101 on the plane P1.

The wireless transmission system 100 performs both wireless communication and wireless power transmission between the fixed-side substrate 101 and the rotation-side substrate 201. The rotation-side substrate 201 is fixed to the shaft 200 and the rotation-side substrate 201 also rotates in association with rotation of the shaft 200. The fixed-side substrate 101 is not fixed to the shaft 200 and the fixed-side substrate 101 does not rotate with rotation of the shaft 200.

The magnetic field occurring from a fixed-side coil 104 reaches a rotation-side coil 204 through a fixed-side magnetic body 105 and a rotation-side magnetic body 205 to wirelessly transmit power from the fixed side to the rotation side. The fixed-side coil 104 is fixed to the fixed-side magnetic body 105 and the rotation-side coil 204 is fixed to the rotation-side magnetic body 205 with adhesive or the like. The fixed-side magnetic body 105 is fixed to the fixed-side substrate 101 and the rotation-side magnetic body 205 is fixed to the rotation-side substrate 201 with the adhesive or the like. An end portion of the fixed-side coil 104 is connected to wiring on the fixed-side substrate 101 and an end portion of the rotation-side coil 204 is connected to wiring on the rotation-side substrate 201.

An optical communication space 300 is an enclosed space surrounded by the fixed-side substrate 101, the fixed-side magnetic body 105, the rotation-side magnetic body 205, the rotation-side substrate 201, and the shaft 200. Since the optical communication space 300 forms the enclosed space, external noise light, which may reduce the communication reliability, is less likely to enter the optical communication space 300 to enable the highly reliable communication.

In the optical communication space 300, light generated from a fixed-side light emitting element 102 reaches a rotation-side light receiving element 203 to wirelessly transmit a communication signal from the fixed side to the rotation side. In addition, light generated from a rotation-side light emitting element 202 reaches a fixed-side light receiving element 103 to wirelessly transmit a communication signal from the rotation side to the fixed side. The wireless transmission system 100 described in the present embodiment is capable of bidirectional communication between the fixed side and the rotation side. The rotation-side light emitting element 202 and the rotation-side light receiving element 203 are arranged on the rotation-side substrate 201, and the fixed-side light emitting element 102 and the fixed-side light receiving element 103 are arranged on the fixed-side substrate 101.

The multiple fixed-side light emitting elements 102 and the multiple rotation-side light emitting elements 202 are arranged on circumferences in order to enable the bidirectional communication at any angle when the rotation-side substrate 201 rotates. The fixed-side light receiving element 103 is arranged on the same circumference as that of the fixed-side light emitting elements 102 and the rotation-side light receiving element 203 is arranged on the same circumference as that of the rotation-side light emitting elements 202. At least one fixed-side light emitting element 102, at least one fixed-side light receiving element 103, at least one rotation-side light emitting element 202, and/or at least one rotation-side light receiving element 203 is arranged on the corresponding substrate.

Figure 2:
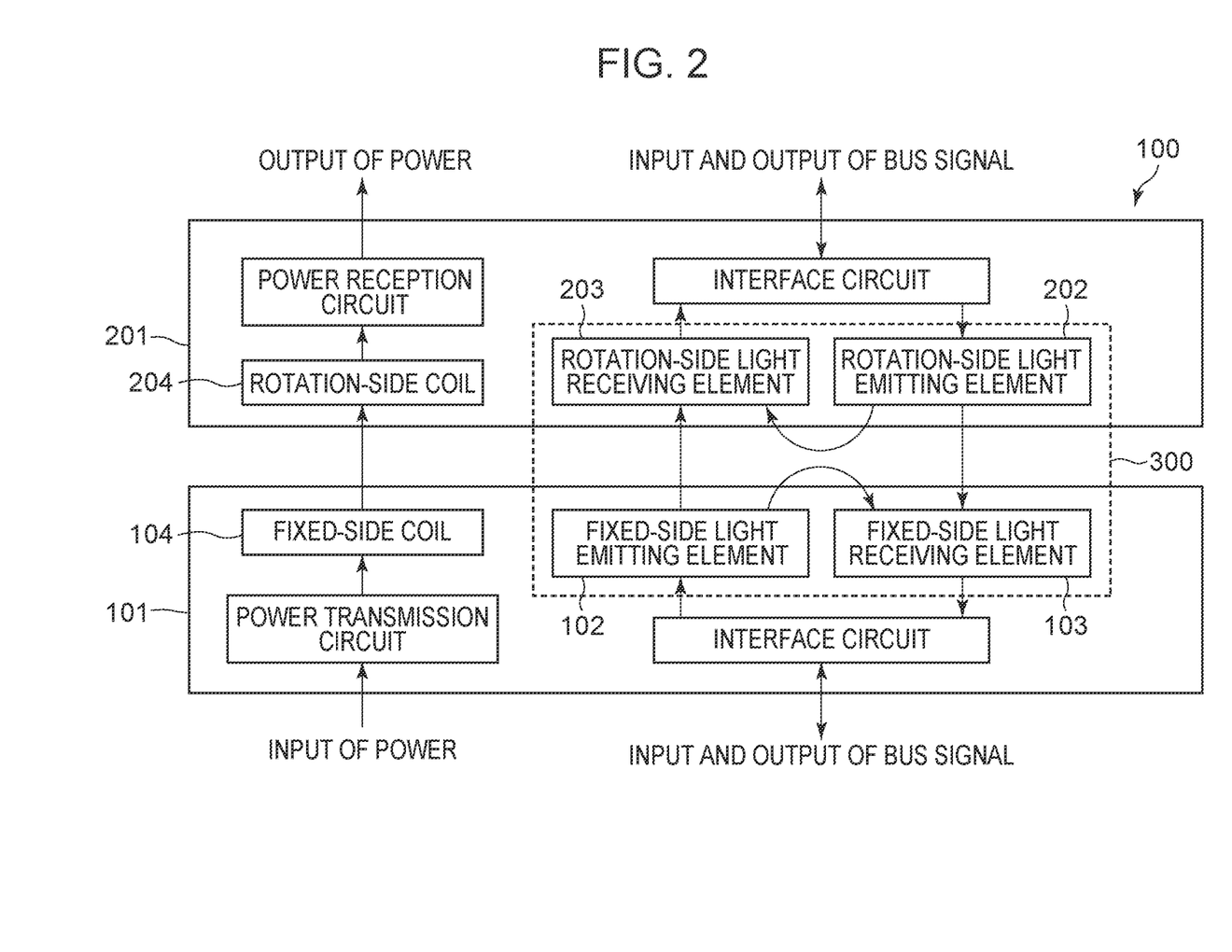
FIG. 2 is a block diagram illustrating a system configuration of the wireless transmission system according to one embodiment.

FIG. 2 is a block diagram illustrating a system configuration of the wireless transmission system 100 according to the present embodiment. In the wireless power transmission, power is first input into the fixed-side substrate 101. The input power is wirelessly transmitted from the fixed-side coil 104 to the rotation-side coil 204 on the rotation-side substrate 201 through magnetic field coupling by a power transmission circuit. The power transmitted to the rotation-side coil 204 is supplied to a load connected to the rotation-side substrate 201 through a power reception circuit.

In wireless signal transmission, a bus signal is first input into the fixed-side substrate 101. The input bus signal is through an interface circuit and is output from the fixed-side light emitting element 102 as an optical signal. The output optical signal is received by the rotation-side light receiving element 203 on the rotation-side substrate 201 and is output to bus wiring connected to the rotation-side substrate 201 through an interface circuit. In contrast, upon input of a bus signal into the rotation-side substrate 201, the input bus signal is through the interface circuit and is output from the rotation-side light emitting element 202 as an optical signal. The output optical signal is received by the fixed-side light receiving element 103 on the fixed-side substrate 101 and is output to bus wiring connected to the fixed-side substrate 101 through the interface circuit. As described above, the wireless transmission system 100 is capable of performing both the transmission of the signal from the rotation side and the transmission of the signal from the fixed side.

Since the bidirectional optical communication is performed in one optical communication space 300, the optical signal output from the fixed-side light emitting element 102 is received by not only the rotation-side light receiving element 203 but also the fixed-side light receiving element 103. Similarly, the optical signal output from the rotation-side light emitting element 202 is received by not only the fixed-side light receiving element 103 but also the rotation-side light receiving element 203. The bus communication is performed by multiple nodes connected to one bus communication line, which commonly recognize the signal voltage level of the bus communication line. In other words, the signal transmitted from a certain node to the bus wiring is also received by the node that has transmitted the signal. Since the signal voltage level in the bus communication is converted into the brightness of the light in the bidirectional optical communication in the wireless transmission system 100, the optical signal output by a certain node may be received by the certain node with no problem. Accordingly, it is possible to perform the bidirectional communication in one optical communication space 300 to realize the reduction in size.

However, since latch may occur due to loopback to disable the communication in this situation, the wireless transmission system 100 is required to have a circuit that avoids this situation in this case. For example, when the optical signal output from the fixed-side light emitting element 102 is received by the fixed-side light receiving element 103, the optical signal is transmitted to input-output bus wiring connected to the fixed-side substrate 101 through the interface circuit. This causes the loopback in which the optical signal is received by the interface circuit and is output again from the fixed-side light emitting element 102 and the latch may occur depending on bus communication specifications to disable the communication. Accordingly, the interface circuit in the wireless transmission system 100 may have a function to avoid the latch phenomenon in the bus communication due to the loopback. For example, the interface circuit may include a logic circuit or the like, which prevents the input signal from being transmitted in the signal output.

In addition, the interface circuit has a function to convert the received bus signal into a signal that drives the light emitting element and a function to transmit the signal output from the light receiving element to the bus wiring. For example, the interface circuit includes a controller area network (CAN) transceiver or the like.

Figure 3A:
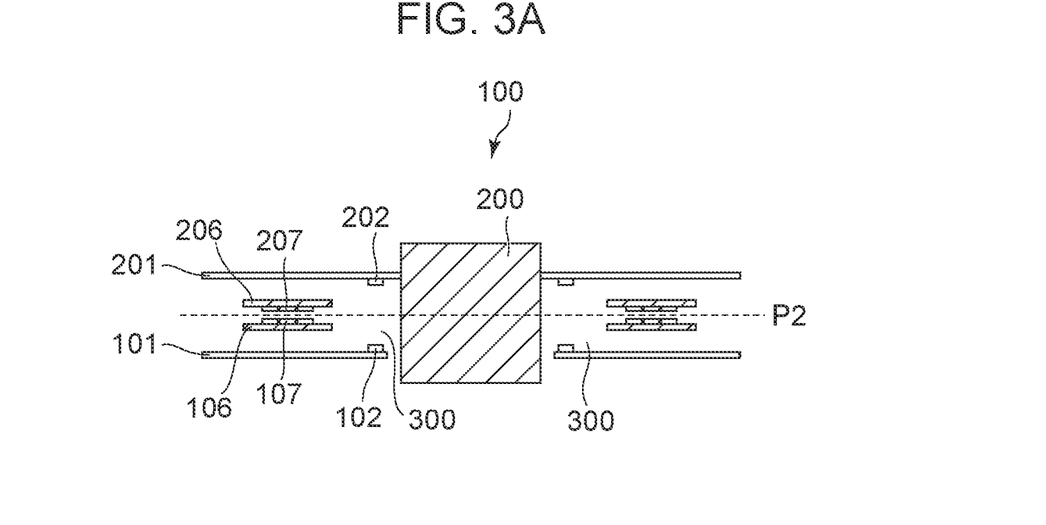
FIG. 3A and FIG. 3B illustrate another structure of the wireless transmission system according to one embodiment.
Figure 3B:
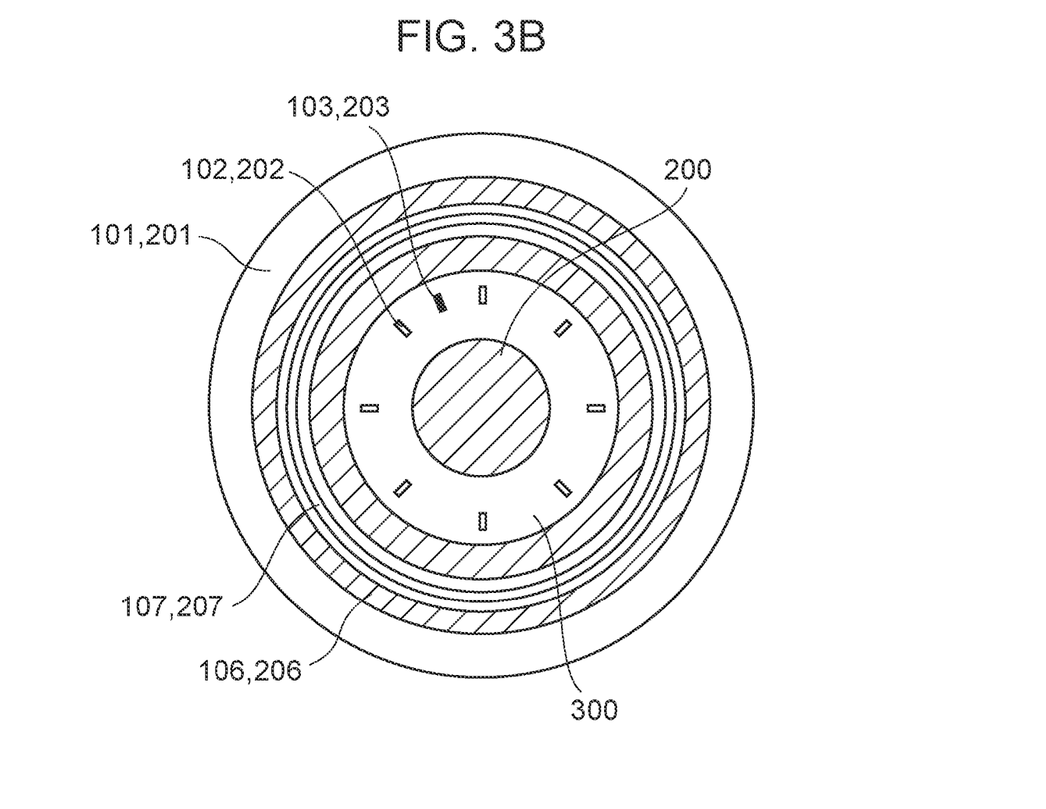

FIG. 3A and FIG. 3B illustrate a structure when the coils in the wireless transmission system 100 are formed of wiring patterns. As in FIG. 1A and FIG. 1B, FIG. 3A is a diagram when the wireless transmission system 100 is viewed from the direction perpendicular to the shaft 200 and FIG. 3B is a diagram when the wireless transmission system 100 is viewed from the direction vertical to the shaft 200 on a plane P2 illustrated in FIG. 3A. FIG. 3B illustrates both a case in which the wireless transmission system 100 is viewed in the direction of the rotation-side substrate 201 on the plane P2 and a case in which the wireless transmission system 100 is viewed in the direction of the fixed-side substrate 101 on the plane P2.

Only the points different from FIG. 1A and FIG. 1B are described here. A rotation-side coil substrate 206 is fixed to the shaft 200 and also rotates in association with rotation of the shaft 200, like the rotation-side substrate 201. A fixed-side coil substrate 106 is not fixed to the shaft 200 and does not rotate with rotation of the shaft 200.

The magnetic field occurring from a fixed-side coil line 107 formed on the fixed-side coil substrate 106 reaches a rotation-side coil line 207 on the rotation-side coil substrate 206 to wirelessly transmit the power from the fixed side to the rotation side. The fixed-side coil substrate 106 receives the power from the fixed-side substrate 101 and the rotation-side coil substrate 206 supplies the power to the rotation-side substrate 201. Since forming the coils with the wiring patterns enables the coils to be manufactured in a manufacturing process of a printed circuit board, it is possible to manufacture the coils inexpensively, compared with the coils using the magnetic bodies illustrated in FIG. 1A and FIG. 1B, and to reduce the variation in characteristics. Although the fixed-side substrate 101 is separated from the fixed-side coil substrate 106 in FIG. 3A and FIG. 3B, the fixed-side coil line 107 may be formed on the fixed-side substrate 101 and the fixed-side coil substrate 106 may be omitted. Also at the rotation side, the rotation-side coil line 207 may be formed on the rotation-side substrate 201 and the rotation-side coil substrate 206 may be omitted.

Figure 4:
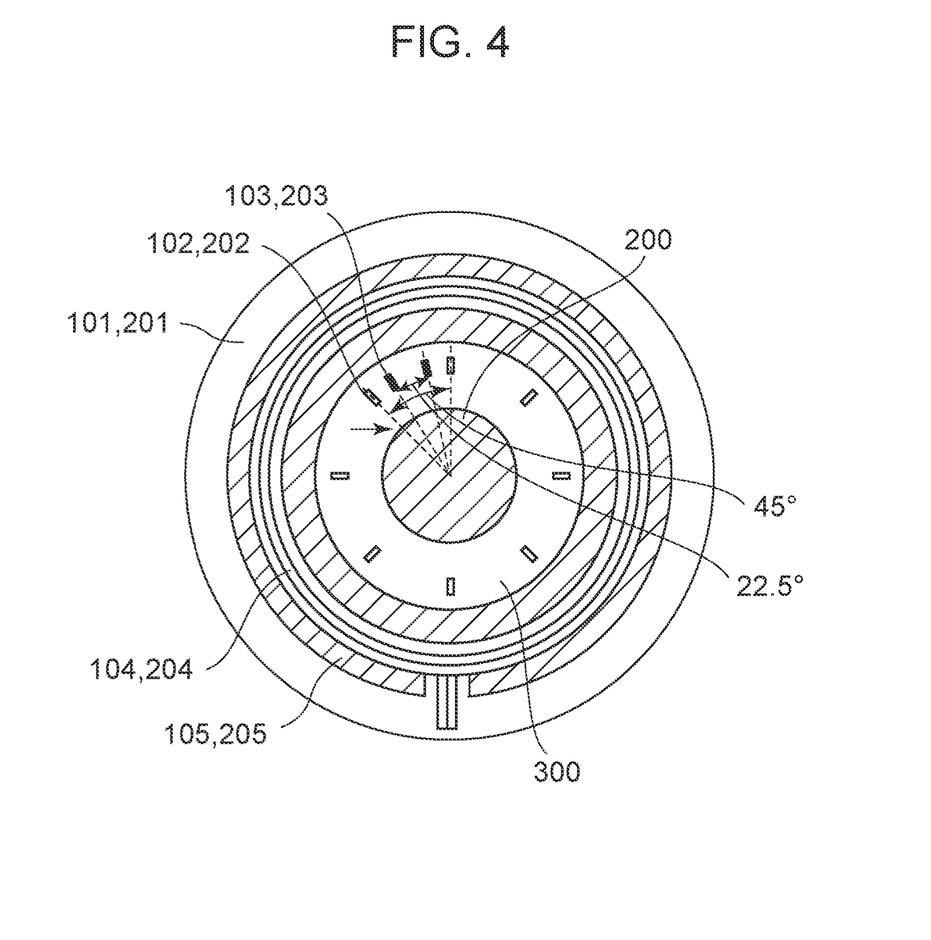
FIG. 4 illustrates an example of how light emitting elements and light receiving elements are arranged in the wireless transmission system according to one embodiment.

FIG. 4 illustrates an example of how the light emitting elements and the light receiving elements are arranged in the wireless transmission system 100. Although the case is exemplified in FIG. 4 in which the eight light emitting elements and the two light receiving elements are provided, the numbers of the light emitting elements and the light receiving elements are not limited to the above ones. Although the fixed-side substrate 101 is exemplified in FIG. 4 when the wireless transmission system 100 illustrated in FIG. 1A is viewed from the direction vertical to the shaft 200 on the plane P1, the same applies to the rotation-side substrate 201.

The eight fixed-side light emitting elements 102 are arranged on the fixed-side substrate 101 at substantially equal intervals at every 45 degrees around the shaft 200. The two fixed-side light receiving elements 103 are arranged on the same circumference as that of the fixed-side light emitting elements 102 and the fixed-side light receiving elements 103 are arranged so as to be apart from each other by 22.5 degrees. As illustrated in FIG. 4, providing the two light receiving elements and setting the arrangement interval of the light receiving elements to half of the arrangement interval of the light emitting elements reduce the amount of variation of the light receiving intensity with rotation to keep the setting value of threshold voltage of a reception circuit high. As a result, the signal-to-noise ratio (SN ratio) of the communication is improved to reduce the communication error rate.

The reduction in the amount of variation of the light receiving intensity with rotation in FIG. 4 will now be described in detail. Since simply increasing the number of the light emitting elements and the light receiving elements that are arranged enables the light to be intensively received at any angle with the rotation of the rotation-side substrate 201, the amount of variation of the light receiving intensity is reduced. However, the number of the components is required to be decreased as much as possible in terms of the mounting area, the power consumption, the cost, and so on.

Figure 5:
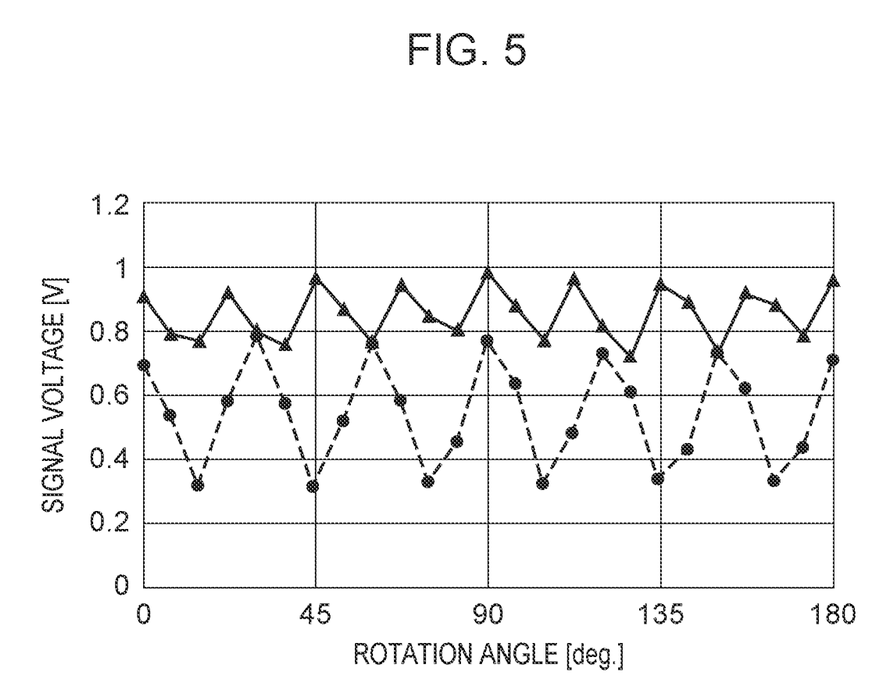
FIG. 5 is a graph indicating results of measurement of signal voltage output from a rotation-side light receiving element in the wireless transmission system according to one embodiment.

FIG. 5 is a graph indicating results of measurement of the wireless transmission system 100 according to the present embodiment. Referring to FIG. 5, the horizontal axis represents the rotation angle of the rotation-side substrate 201 and the vertical axis represents signal voltage at which the light output from the fixed-side light emitting element 102 is received by the rotation-side light receiving element 203 while rotating and the received light is output from the rotation-side light receiving element 203.

A solid line in the graph in FIG. 5 indicates a result of measurement in the wireless transmission system 100 illustrated in FIG. 1A and FIG. 1B. A total of 10 elements including the eight light emitting elements and the two light receiving elements are used in this case. A broken line in the graph in FIG. 5 indicates a result of measurement in a case in which the number of elements is greater than that in the wireless transmission system 100 in FIG. 1A and FIG. 1B, specifically, in a case in which twelve light emitting elements are arranged. In this case, the light emitting elements are arranged at substantially equal intervals at every 30 degrees. One light receiving element is arranged on the same circumference as that of the light emitting elements. The broken line in the graph in FIG. 5 indicates the result of measurement when a total of 13 elements are used. In each of the cases of the solid line and the broken line, the light emitting element is arranged at a position of 0 degrees on the horizontal axis in FIG. 5 and the remaining light emitting elements are arranged at substantially equal intervals from the position of 0 degrees. The light receiving element is arranged between the light emitting elements. The diameter of the circumference on which the elements are arranged is set to 81 mm. Although the results from 0 degrees to 180 degrees are indicated in FIG. 5, the results from 180 degrees to 360 degrees are omitted in FIG. 5 because the results from 180 degrees to 360 degrees are symmetrical to the results from 0 degrees to 180 degrees.

The result of measurement of the broken line indicates that the signal voltage intensity is increased at every 30 degrees. However, the light receiving intensity is greatly decreased at 15 degrees, 45 degrees, 75 degrees, 105 degrees, 135 degrees, and 165 degrees, which are half of the arrangement interval of the light emitting elements, because the position of the rotation-side light receiving element is right in the middle of the two adjacent fixed-side light emitting elements at these angles. In contrast, the light emitting elements are arranged at every 45 degrees and the signal voltage intensity is increased at every 22.5 degrees in the result of measurement of the solid line. This is because, at 22.5 degrees, 67.5 degrees, 112.5 degrees, and 157.5 degrees at which the position of one light receiving element, among the two rotation-side light receiving elements, is right in the middle of the two adjacent fixed-side light emitting elements, the position of the other light receiving element is shifted by 22.5 degrees. In other words, at 45 degrees, 90 degrees, 135 degrees, and 180 degrees at which the position of one light receiving element is most apart from the position of the light emitting element, the position of the other light receiving element coincides with the position of the light emitting element. Accordingly, summing up the outputs from the two light receiving elements enables the reduction in the light receiving intensity to be suppressed. In addition, since not only the amount of variation of the light receiving intensity is small but also the outputs from the two light receiving elements are summed up, the entire signal voltage is higher than the result of measurement of the broken line to further improve the SN ratio. As described above, arranging the multiple light receiving elements and reducing the arrangement angle of the light receiving elements to half of the arrangement angle of the light emitting elements enable the stable communication even when the total number of the light emitting elements and the light receiving elements is decreased.

The relationship in the position and the number between the light emitting elements and the light receiving elements may be opposite to the relationship described in the present embodiment.

Specifically, the number of the light receiving elements may be greater than the number of the light emitting elements. In this case, the light receiving elements are arranged on the same circumference at substantially equal intervals and the arrangement interval of the light emitting elements is half of the arrangement interval of the light receiving elements.

Figure 6A:
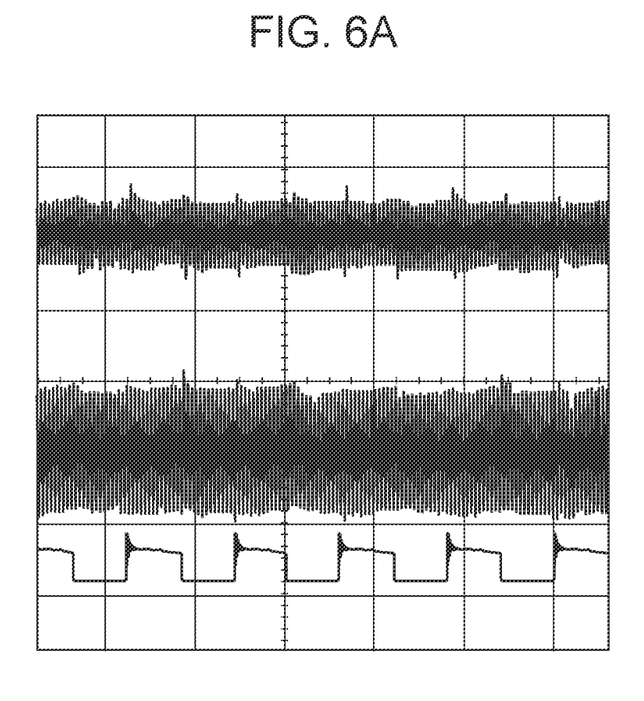
FIG. 6A and FIG. 6B are graphs for comparison between a case in which a differential amplifier is used and a case in which the differential amplifier is not used in the wireless transmission system according to one embodiment.
Figure 6B:
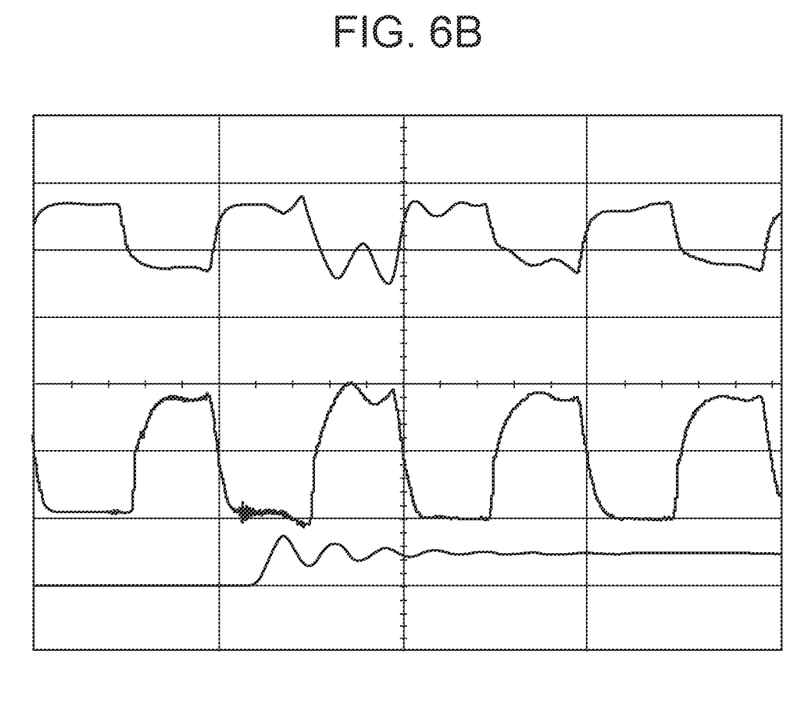

Since the distance between the light receiving element and the coil is short in the wireless transmission system 100 because of its structure, switching noise in a wireless power supply circuit, which is radiated from the coil as the magnetic field and enters the light receiving element, may reduce the SN ratio. In this case, two trans-impedance amplifiers, which are reception circuits of the light receiving elements, are prepared. The input of one trans-impedance amplifier is connected to the light receiving element, the input of the other trans-impedance amplifier is connected to an RC equivalent circuit, which simulates the light receiving element, and the output of each trans-impedance amplifier is connected to the input of a differential amplifier. Since the switching noise is superimposed in phase on the outputs from the two trans-impedance amplifiers, the use of the differential amplifier cancels the switching noise. FIG. 6A and FIG. 6B are graphs for comparison between a case in which the differential amplifier is used in the wireless transmission system 100 and a case in which the differential amplifier is not used in the wireless transmission system 100. FIG. 6B is a graph resulting from enlargement of part of FIG. 6A. In FIG. 6A and FIG. 6B, the waveforms indicate, from the top, the output voltage from the trans-impedance amplifier to which the light receiving element is connected, the output voltage from the differential amplifier, and the voltage of the switching waveform of the wireless power supply circuit. FIG. 6A and FIG. 6B indicate that the amplitude of ringing noise in synchronization with the switching waveform is decreased in the output voltage from the differential amplifier, compared with that in the output voltage from the trans-impedance amplifier. As described above, the use of the differential amplifier in the wireless transmission system 100 enables the more stable communication. The differential amplifier may be connected to one of the fixed-side light receiving element 103 and the rotation-side light receiving element 203 or the differential amplifier may be connected to each of the fixed-side light receiving element 103 and the rotation-side light receiving element 203.

According to the present disclosure, it is possible to further reduce the size of the wireless transmission system that performs the wireless power transmission and the wireless communication by appropriately arranging the elements used in the wireless communication in the wireless transmission system.

Other Embodiments

Various embodiments of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While example embodiments have been described, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2020-177670 filed Oct. 22, 2020, which is hereby incorporated by reference herein in its entirety.

What is claimed is:

1. A wireless transmission system comprising:
a first substrate;
a first coil configured to be arranged on the first substrate and to be used for wireless power transmission;
at least one first light emitting element configured to be arranged on a circumference on the first substrate and inside the first coil and to be used for wireless communication;
at least one first light receiving element configured to be arranged on the same circumference as that of the at least one first light emitting element and to be used for the wireless communication;
a second substrate;
a second coil configured to be arranged on the second substrate and to be used for the wireless power transmission;
at least one second light emitting element configured to be arranged on a circumference on the second substrate and inside the second coil and to be used for the wireless communication; and
at least one second light receiving element configured to be arranged on the same circumference as that of the at least one second light emitting element and to be used for the wireless communication,
wherein the first substrate and the second substrate are arranged so as to be opposed to each other so that the first coil, the at least one first light emitting element, and the at least one first light receiving element are opposed to the second coil, the at least one second light emitting element, and the at least one second light receiving element.

2. The wireless transmission system according to claim 1, wherein the first coil is fixed to a first magnetic body fixed to the first substrate, and
wherein the second coil is fixed to a second magnetic body fixed to the second substrate.

3. The wireless transmission system according to claim 1, wherein each of the first coil and the second coil is formed of a wiring pattern.

4. The wireless transmission system according to claim 1, wherein the at least one first light emitting element is arranged on the same circumference on the first substrate at substantially equal intervals, and
wherein the at least one second light emitting element is arranged on the same circumference on the second substrate at substantially equal intervals.

5. The wireless transmission system according to claim 4, wherein an arrangement interval of the at least one first light receiving element is half of an arrangement interval of the at least one first light emitting element, and
wherein an arrangement interval of the at least one second light receiving element is half of an arrangement interval of the at least one second light emitting element.

6. The wireless transmission system according to claim 1, wherein the at least one first light receiving element is arranged on the same circumference on the first substrate at substantially equal intervals, and
wherein the at least one second light receiving element is arranged on the same circumference on the second substrate at substantially equal intervals.

7. The wireless transmission system according to claim 6, wherein an arrangement interval of the at least one first light emitting element is half of an arrangement interval of the at least one first light receiving element, and
wherein an arrangement interval of the at least one second light emitting element is half of an arrangement interval of the at least one second light receiving element.

8. The wireless transmission system according to claim 1, wherein at least one of outputs of reception circuits of the at least one first light receiving element and the at least one second light receiving element is connected to a first input of a differential amplifier.

9. The wireless transmission system according to claim 8, wherein an RC equivalent circuit simulating the light receiving element is connected to a second input of the differential amplifier.

10. A method of controlling a wireless transmission system in which a first substrate and a second substrate are arranged so as to be opposed to each other, wherein a first coil, at least one first light emitting element arranged on a circumference, and at least one first light receiving element arranged on the same circumference as that of the at least one first light emitting element are arranged on the first substrate, and wherein a second coil, at least one second light emitting element arranged on a circumference, and at least one second light receiving element arranged on the same circumference as that of the at least one second light emitting element are arranged on the second substrate, the method comprising:
    performing wireless power transmission using the first coil and the second coil; and
    performing wireless communication using the at least one first light emitting element, the at least one first light receiving element, the at least one second light emitting element, and the at least one second light receiving element.

11. A non-transitory computer-readable storage medium storing instructions that, when executed by a computer, cause the computer to perform a process of controlling a wireless transmission system in which a first substrate and a second substrate are arranged so as to be opposed to each other, wherein a first coil, at least one first light emitting element arranged on a circumference, and at least one first light receiving element arranged on the same circumference as that of the at least one first light emitting element are arranged on the first substrate, and wherein a second coil, at least one second light emitting element arranged on a circumference, and at least one second light receiving element arranged on the same circumference as that of the at least one second light emitting element are arranged on the second substrate,
    the process comprising:
        performing wireless power transmission using the first coil and the second coil, and
        performing wireless communication using the at least one first light emitting element, the at least one first light receiving element, the at least one second light emitting element, and the at least one second light receiving element.

* * * * *